United States Patent
Shih et al.

(10) Patent No.: US 6,214,670 B1
(45) Date of Patent: Apr. 10, 2001

(54) METHOD FOR MANUFACTURING SHORT-CHANNEL, METAL-GATE CMOS DEVICES WITH SUPERIOR HOT CARRIER PERFORMANCE

(75) Inventors: Jiaw-Ren Shih; Shui-Hung Chen; Jian-Hsing Lee, all of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/358,986

(22) Filed: Jul. 22, 1999

(51) Int. Cl.⁷ .................................................. H01L 21/336
(52) U.S. Cl. .......................... 438/259; 438/270; 438/303
(58) Field of Search ..................................... 438/259, 265, 438/270, 299, 589, 592, 303, 305, 306

(56) References Cited

U.S. PATENT DOCUMENTS

| | | | |
|---|---|---|---|
| 5,434,093 | * 7/1995 | Chau et al. .............................. | 437/41 |
| 5,489,543 | 2/1996 | Hong ...................................... | 437/41 |
| 5,538,913 | 7/1996 | Hong ...................................... | 437/44 |
| 5,670,401 | 9/1997 | Tseng ..................................... | 437/44 |
| 5,817,558 | * 10/1998 | Wu ......................................... | 438/291 |
| 5,998,288 | * 7/1995 | Gardner et al. ....................... | 438/589 |

\* cited by examiner

Primary Examiner—Chandra Chaudhari
Assistant Examiner—Jack Chen
(74) Attorney, Agent, or Firm—George O. Saile; Stephen B. Ackerman

(57) ABSTRACT

In short-channel MOSFET devices with gates constructed using conventional double-diffusing techniques, damage to the silicon substrate region near the gate structure causes hot carrier effects that degrade the device performance. The inventive process described minimizes damage to the silicon substrate in the region of the metal gate structure thereby providing a MOSFET device with superior hot carrier effect performance.

14 Claims, 5 Drawing Sheets

METHOD FOR MANUFACTURING SHORT-CHANNEL, METAL-GATE CMOS DEVICES WITH SUPERIOR HOT CARRIER PERFORMANCE

FIELD OF THE INVENTION

The present invention relates to the manufacture of semiconductor devices and, more particularly to the manufacture of VLSI CMOS structures having metal gates and exhibiting superior hot-carrier performance.

BACKGROUND OF THE INVENTION

As demand for higher device densities on silicon wafers has increased, the size of individual devices has had to shrink. In particular, in the construction of Metal Oxide Semiconductor Field Effect Transistor (MOSFET) gates, the channel lengths have been reduced. As channel lengths have decreased, in particular to lengths less than about 1.5$\mu$m, the influence of hot carrier effects has become more and more pronounced. Hot carrier effects in FETs are generally caused by damage to the silicon substrate in the immediate vicinity of the gate. This damage is caused by the conventional processing steps in gate construction and by source and drain doping.

Also, the formation of reliable metal gates in CMOS VLSI structures has heretofore been difficult. The low selectivity between metal and silicon dioxide ("oxide") in a typical etch process make is difficult to control the size and shape of metal pattern gates. In a typical etch step, the silicon substrate is often damaged. This damage results in poor hot carrier effect performance and also creates other problems that result in low wafer yield.

Discussion of the Prior Art

Various strategies for improving device performance and chip yield have been suggested. For example, U.S. Pat. No. 5,434,093 for INVERTED SPACER TRANSISTOR; issued Jul. 18, 1995 to Robert S. Chau, et al., teaches a method for forming narrow length transistors by forming a trench in a first layer over a semiconductor. Spacers and gate dielectric are formed and then the trench is filled with gate electrode material which is chemically-mechanically polished back to isolate the gate material within the trench. The first layer is then removed leaving the gate dielectric, gate electrode and spacers.

In U.S. Pat. No. 5,489,543 for METHOD OF FORMING A MOS DEVICE HAVING A LOCALIZED ANTI-PUNCHTHROUGH REGION; issued Feb. 6, 1996 to Gary Hong discloses a method for forming a MOS device having a localized anti-punchthrough region which is adjacent to but not in contact with source/drain regions of the MOS device. A trench is formed by depositing a conducting layer on an oxide layer located on a channel region of the MOS device. The trench is used as a self-alignment mask for subsequent implantation processes to form the localized anti-punchthrough region.

In U.S. Pat. No. 5,538,913 for PROCESS FOR FABRICATING MOS TRANSISTORS HAVING FULL-OVERLAP LIGHTLY-DOPED DRAIN STRUCTURES; issued Jul. 23, 1996 to Gary Hong, another method for constructing drain regions is taught. An oxide layer on a semiconductor substrate defines an active region foe the MOS device. The oxide layer serves as a shielding mask for implantation of a lightly-doped region. A shielding layer is next formed with an opening over the substrate, the opening having two side walls that define a channel region. Gate insulation is formed at the opening and then spacers are added at the side walls. The channel region is implanted using the spacers as a shielding mask. A conducting layer is formed over the surface of the gate thereby forming the MOS device. The shielding layer is removed and the remaining gate and field oxide layers are used as masks for additional implantation forming a heavily-doped region where the lightly-doped region completely overlaps the gate and extends into the drain and source regions of the MOS device.

Finally, U.S. Pat. No. 5,670,401 for METHOD FOR FABRICATING A DEEP SUBMICRON MOSFET DEVICE USING AN IN-SITU POLYMER SPACER TO DECREASE DEVICE CHANNEL LENGTH; issued Sep. 23, 1997 to Horng-Huei Tseng teaches a fabrication technique wherein a polymeric spacer is formed in a photo resist layer. The polymeric spacer reduces the opening in the photo resist to a width narrower than that obtainable through conventional lithographic/etch techniques thereby allowing the formation of a narrow gate structure overlaying a local threshold adjust region implanted in the silicon substrate. In contradistinction, the inventive method requires no polymer spacer to control gate width but relies on a unique sequence of processing steps to form a reliable metal gate while preserving a pad oxide layer under a normal silicon oxide spacer.

No combination of these prior art references are seen to teach or suggest the inventive process for forming the recessed, metal-gate CMOS devices of the instant invention.

SUMMARY OF THE INVENTION

The present invention features a method for forming a high-reliability metal gate structure in a CMOS VLSI FET structure. The unique process steps result in the reduction of damage to the silicon substrate while better controlling the device-to-device uniformity of the metal gates. The preservation of an oxide layer under a silicon oxide spacer around the metal gate improves hot carrier effect performance of the MOSFETs. The gate structures are self-aligned without the necessity of extra masking steps. The method also results in essentially no depletion in the gate region or dopant penetration. Gate structures having acceptably low sheet resistance are also obtained. The overall result is a device with lower junction leakage current that device formed using the techniques of the prior art.

BRIEF DESCRIPTION OF THE DRAWINGS

A complete understanding of the present invention may be obtained by reference to the accompanying drawings, when taken in conjunction with the detail description thereof and in which.

DESCRIPTION OF THE PREFERRED EMBODIMENT

Generally speaking this invention relates to the manufacture of VLSI CMOS semiconductor structures employing metal gates. The inventive manufacturing steps result in a high-reliability metal gate structures as well as minimization of damage to the silicon substrate in the area of the gate. The minimized damage to the silicon substrate results in a device with superior hot carrier effect performance.

Figure 1:
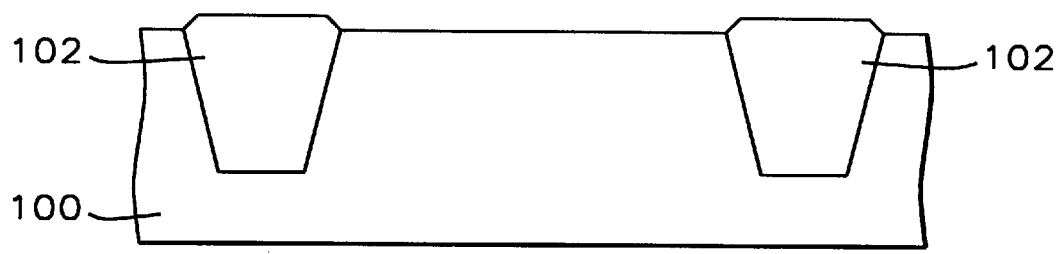
FIG. 1 is a cross-sectional, schematic view of a portion of a silicon substrate with STIs formed therein.

Referring first to FIG. 1, there is shown a cross-sectional view of a portion of a silicon substrate, 100, with Shallow Trench Isolation (STI) regions 102 formed is therein. STI regions 102 comprise about 3000Å to 6000Å of thermally-grown silicon dioxide ($SiO_2$) in a shallow, etched trench in substrate 100. In alternate embodiments, the $SiO_2$ forming STIs 102 may be deposited using CVD techniques. Substrate 100 is preferably p-type, single crystalline silicon with a <100> crystallographic orientation. In other embodiments, the surface of substrate 100 and STI regions 102 could be etched to a smooth, planar surface.

After formation of STI regions 102, Substrate 100 must be prepared for further processing by wet cleaning, preferably using a dilute hydrofluoric acid treatment.

Figure 2:
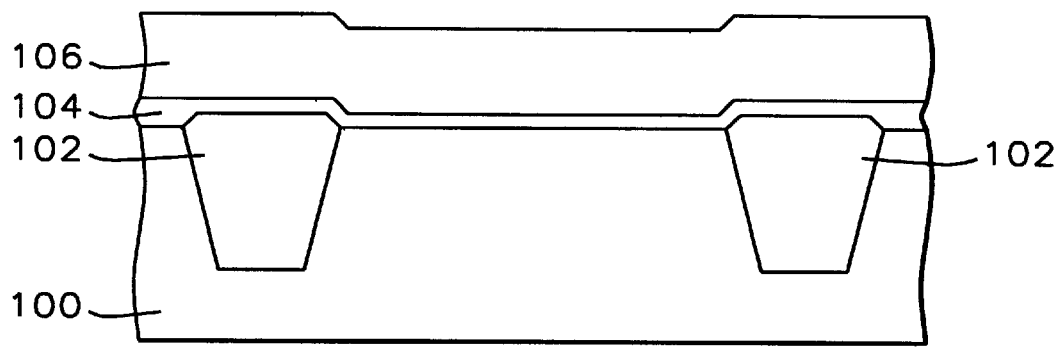
FIG. 2 is cross-sectional, schematic view of the silicon substrate of FIG. 1 having oxide and silicon nitride masking layers deposited thereon.

Referring next to FIG. 2, a thin dielectric layer of silicon dioxide ($SiO_2$) or "oxide" (pad or buffer oxide) 104 is shown disposed over substrate 100 and STI regions 102. Oxide layer 104 is formed using well-know thermal growth techniques to a thickness in the range of between 100Å and 200Å. In alternate embodiments, oxide layer 104 may be deposited using low-pressure chemical vapor deposition, (LPCVD) procedures, preferably at a temperature in the range of about 700° to 750° C. Thermally-grown oxides have been shown, however, to yield superior performance. Pad oxide layer 104 serves, among other things, as a thermal insulator protecting substrate 100 during subsequent processing steps.

An insulating film of silicon nitride 106 is formed on oxide layer 104 using low-pressure chemical vapor deposition (LPCVD) techniques to a thickness in the range of about 2000Å. Silicon nitride layer 106 serves as an oxidation mask. Silicon nitride is chosen because oxygen and water vapor diffuse very slowly through it thereby preventing oxidation of substrate regions protected by the layer. The nitride itself oxidizes very slowly so that the nitride layer also remains an effective oxidation barrier layer during the subsequent field oxide growth processes.

Figure 3:
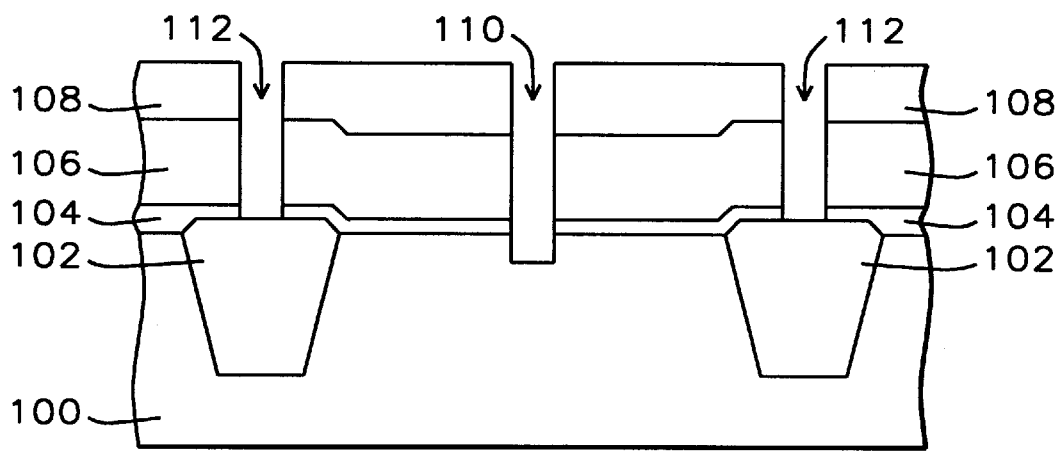
FIG. 3 is a cross-sectional, schematic view of the substrate of FIG. 2 with a photo resist layer and etched gate region.

Next, a photo resist layer 108 is applied, FIG. 3 and self-aligning gate region 110 and STI regions 112 are defined using micro-lithographic techniques also well know to those skilled in the art. Conventional aligners or "printers" utilizing visible light, ultra-violet light, electrons or x-rays may be utilized to expose the desired pattern onto photoresist layer 108. A plasma etching step, preferably utilizing a $CF_4O_2$ plasma, removes the silicon nitride layer 106 and oxide layer 104 in the gate and STI areas 110 and 112, respectively. In addition, etching continues into substrate 100 at the gate region 110 to a depth of approximately 500 to 2000Å.

Figure 4:
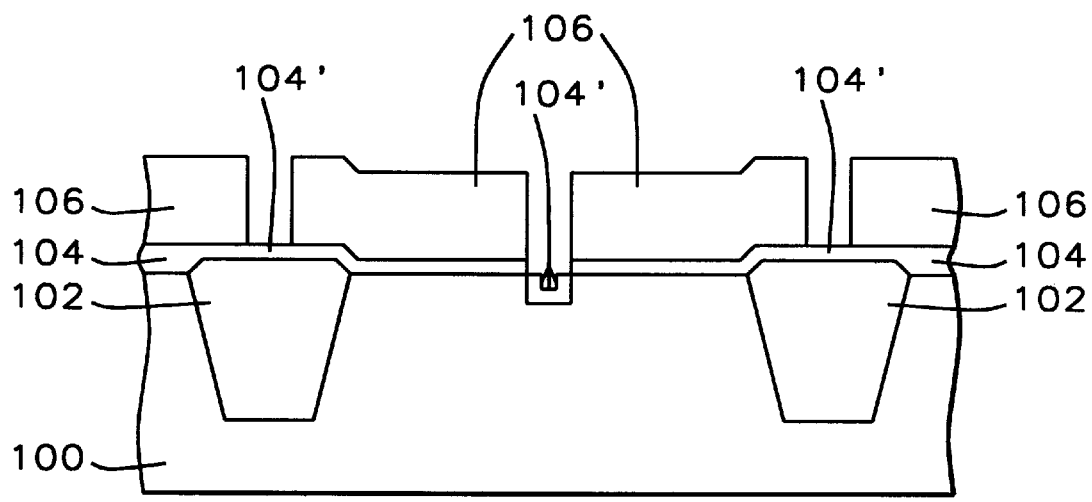
FIG. 4 is a cross-sectional, schematic view of the substrate of FIG. 3 showing a second oxide layer formed thereon.

Referring now to FIG. 4, photo resist layer 108 (FIG. 3) is first stripped using an organic stripper, an oxidizing stripper or a dry etch process, all of which are well know to those skilled in the art. Silicon nitride mask layer 106 remains with etched regions 110, 112 (FIG. 3) available for oxide deposition. A new oxide layer 104' is applied to exposed substrate 100 surfaces in pad regions 112 and gate region 110. As with the original oxide layer 104, oxide layer 104' has a thickness is in the range of 100Å to 200Å and is, preferably, thermally grown.

Figure 5:
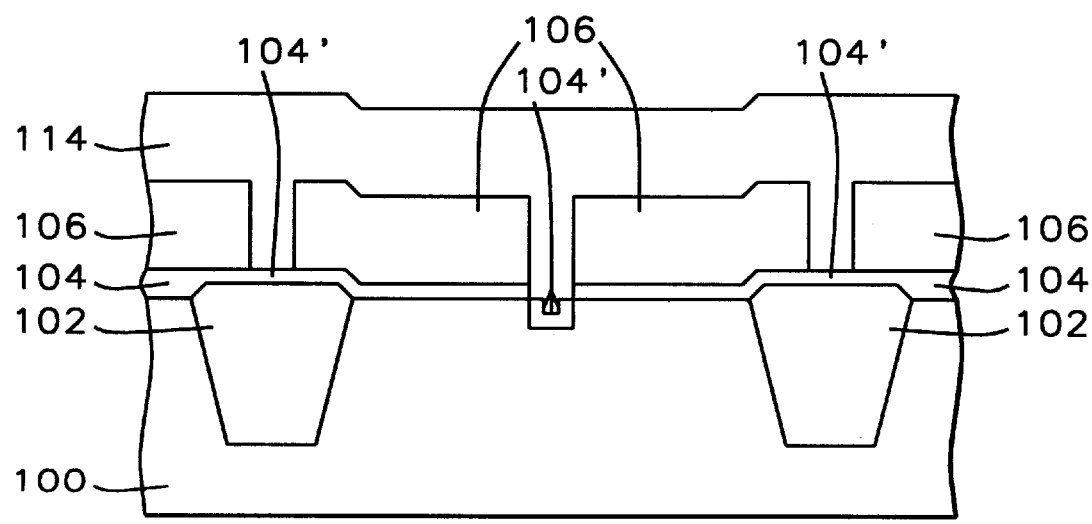
FIG. 5 is a cross-sectional, schematic view of the substrate of FIG. 4 showing a Ti:W layer deposited.

Referring now to FIG. 5, Titanium/Tungsten (Ti:W) layer 114 is next sputtered over the entire region. Any variant of the sputter process may be utilized as long as proper step coverage is maintained. The Ti:W penetrates areas 110, 112 (FIG. 3) and contacts second oxide layer 104'.

Figure 6:
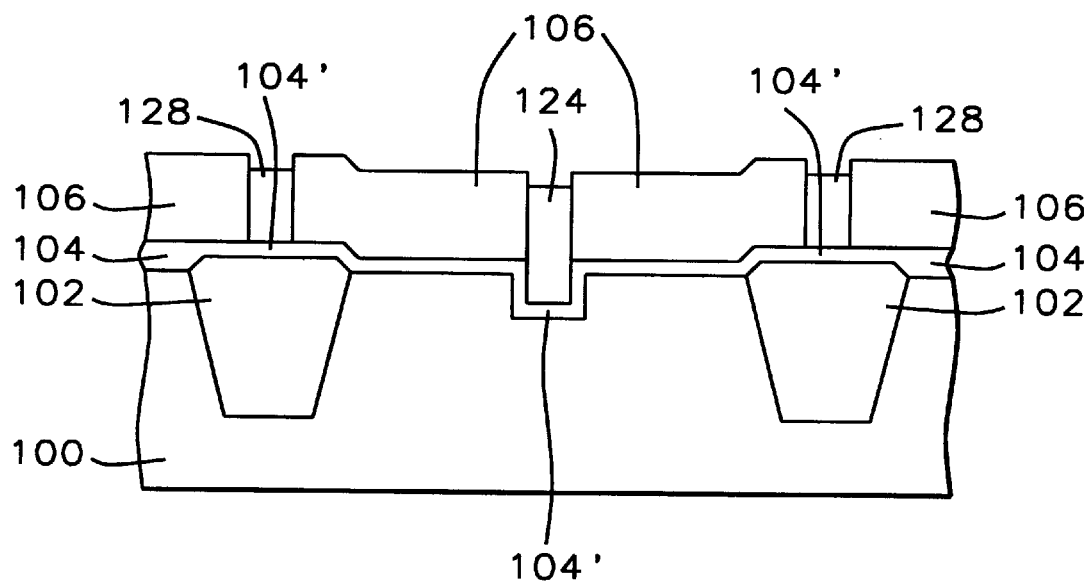
FIG. 6 is a cross-sectional, schematic view of the substrate of FIG. 5 after etch-back of the Ti:W layer.

Referring now to FIG. 6, Ti:W layer 114 has been partially removed using either a wet-etch or a wet chemical-machine polish (WCMP) operation, leaving Ti:W metallic gate 124 in the gate region 110 (FIG. 3). Metal structures 128 are also left in STI pad regions 112 (FIG. 3). The etch of CMP operation has left the surface of gate 124 and structures 128 slightly below the surface of nitride layer 106.

Figure 7:
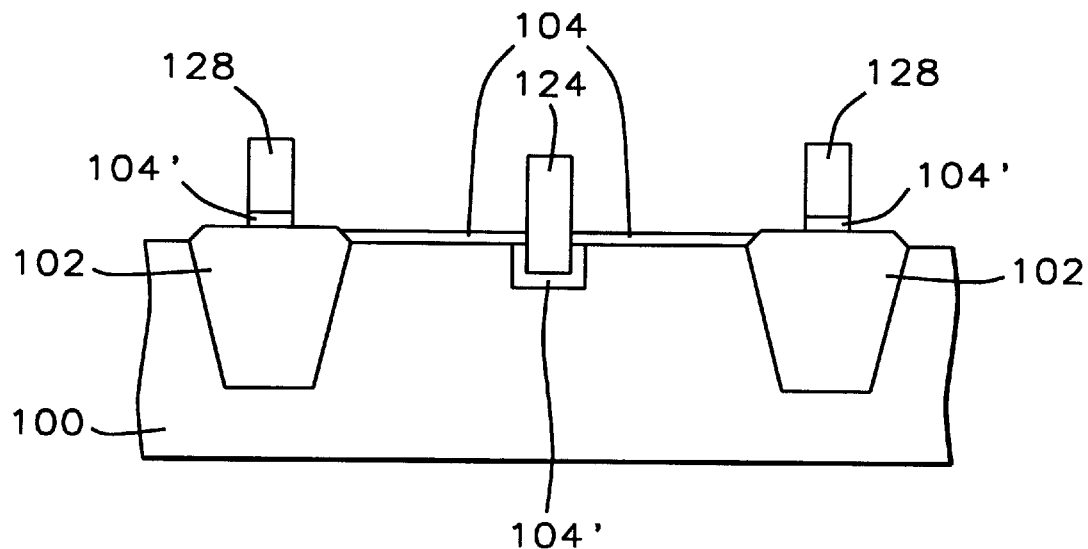
FIG. 7 is a cross-sectional, schematic view of the substrate of FIG. 6 showing the silicon nitride layer removed.

Referring now to FIG. 7, nitride layer 106 is now removed using a hot phosphoric acid etch leaving metal gate 124 and structure 128 completely exposed. Substrate 100, however, is still completely isolated by the combination of oxide layers 104 and 104'.

Figure 8:
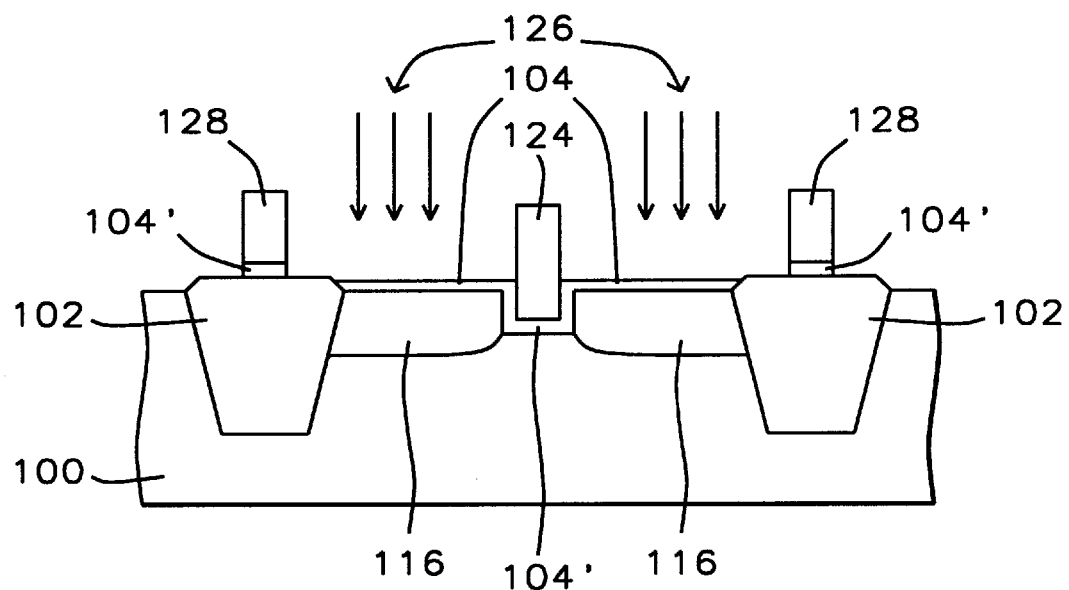
FIG. 8 is a cross-sectional, schematic view of the substrate of FIG. 7 with lightly doped drains (LDD) implanted.

Referring now to FIG. 8, a first, light implantation of Lightly Doped Drain (LDD) regions 116 has been performed through pad oxide layer 104. Energies in the range of 10–20 keV have been found acceptable for the first implantation with of $1-2 \times 10^{13}$ atoms/$cm^2$ of Phosphorus being a typical dose. The use of a double implantation method when constructing short-channel MOSFET devices (i.e., channel structures $\leq 1.25$ $\mu M$) has been shown to form a lightly doped section of the drain at the edge near the channel. This lightly-doped region helps reduce hot carrier effects which become a problem in short-channel devices, by spreading the field potential across a wider region. In addition, the location of the injection position (i.e., the $E_M$ point) is better controlled to insure its location is under the gate edge.

Figure 9:
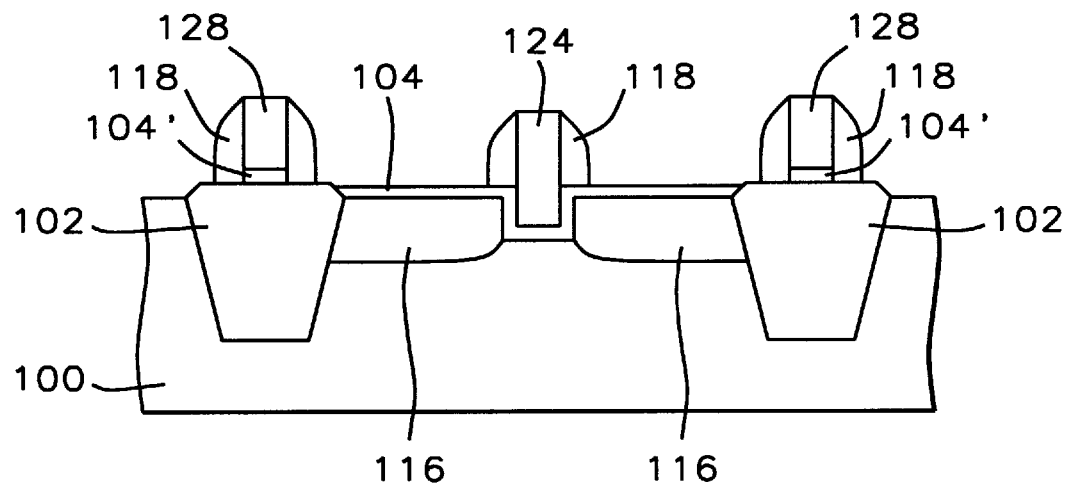
FIG. 9 is a cross-sectional, schematic view of the substrate of FIG. 8 with oxide spacers formed on the gate.

Referring now to FIG. 9, spacers 118 have been formed over gate 124 and structure 128. In conventional MOSFET structures, spacers 118 are generally formed by high-temperature vapor deposition of $SiO_2$ or $Si_3O_4$ using techniques well known to those skilled in the art. In the inventive structure, spacers 118 are thermally-grown $SiO_2$ similar to pad oxide 104 and gate oxide 104'. The preservation of thermal insulating pad oxide 104 under spacers 118 adjacent gate 124 allows the safe formation of the spacers without damage to the underlying substrate. The thermally-grown oxide of the present invention provides a superior material from both dielectric constant of the material and step coverage considerations. The latter consideration is important as the width of spacer 118 at gate 124 determines the profile of the second source/drain region implantation. Also, in devices manufactured using the inventive method, the intact pad oxide layer 104 beneath spacers 118 protects the portion of substrate 100 beneath spacers 118 where hot carrier stress generally occurs. The inventive process which yields devices with minimized propensity for hot carrier generation may, therefore, be utilized in manufacturing small MOSFET devices having excellent performance characteristics.

Figure 10:
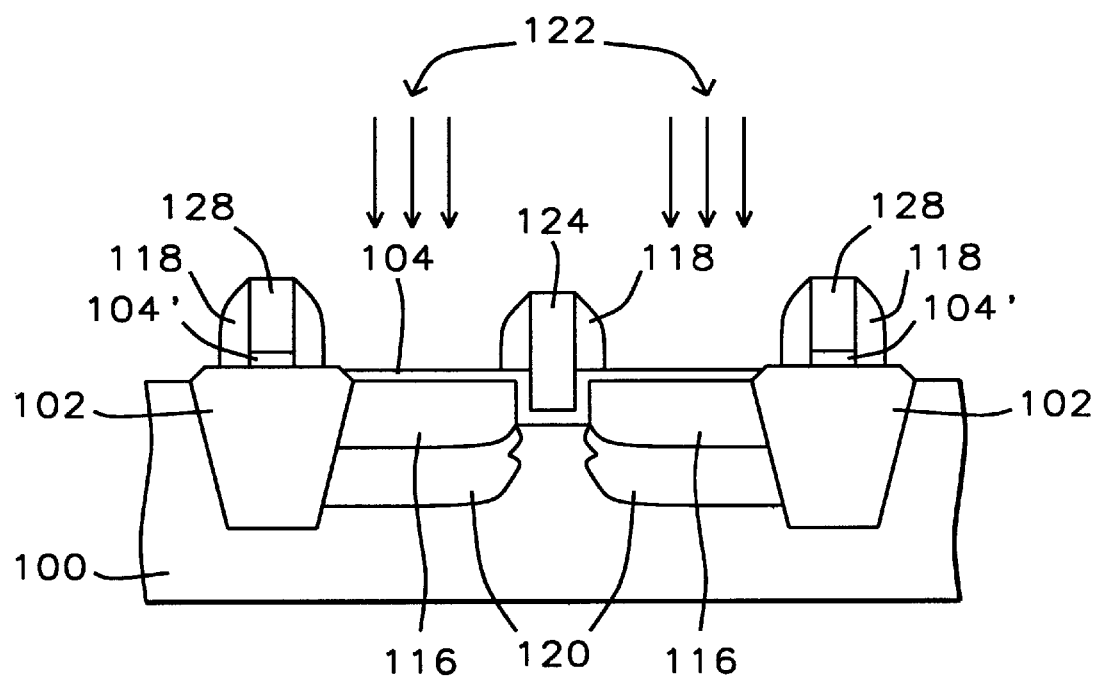
FIG. 10 is a cross-sectional, schematic view of the substrate of FIG. 9 with source and drain regions implanted by a second ion implantation step.

Referring now to FIG. 10, the second implantation of source and drain regions 116. In this case a higher injection energy is used to implant a dose 122 of Arsenic of approximately $1\times10^{15}$ atoms/cm$^2$. The resulting doped regions 120 merge with lightly-doped regions 116 to form low-resistance source and drain structures. In the inventive device, sheet resistance in the double-dopes region is generally in the range of 10 to 100 ohms per cm$^2$.

Devices may be finished by application of connection layers, passivation layers and the like according to methods and processes well know to those skilled in the art.

It appears that the superior performance of the CMOS devices constructed in accordance with the method the present invention may be attributed to the novel recess in the substrate which creates elevated source/drain regions relative to the metallic gate and/or to the use of the particular metal gate construction.

Since other modifications and changes varied to fit a particular operating requirements and environment will be apparent to those skilled in the art, the invention is not considered limited to the example chosen for purposes of disclosure, and covers all changes and modifications which do not constitute a departure from the true spirit and scope of the invention.

Having thus described the invention, what is desired to be protected by Letters Patent is presented in the subsequent appended claims.

What is claimed is:

1. A method for manufacturing a short-channel MOSFET device in a semiconductor substrate having a surface and containing shallow trench isolation (STI) regions, comprising the steps of:

(a) forming a pad oxide layer on the substrate surface;

(b) forming an insulating layer on the first oxide layer;

(c) forming a photoresist layer on the insulating layer;

(d) forming an etching mask by patterning the photoresist layer to define at least a gate region of the device;

(e) forming an opening into the gate region of the substrate by etching the insulating layer and the first oxide layer and into a portion of the substrate, whereby the the gate region is recessed relative to the surface of the semiconductor substrate;

(f) removing the photoresist from the substrate;

(g) forming a gate oxide layer on the substrate in the recessed gate region opening;

(h) depositing a layer of metal over the substrate thereby forming a gate metal conductor in the opening over the gate oxide layer;

(i) removing the layer of metal apart from the gate metal conductor from the top surface of insulating layer, (j) removing the insulating layer, thereby exposing the gate metal conductor and the pad oxide surfaces;

(k) forming a lightly doped drain (LDD) region in the substrate defined by self alignment with the gate metal conductor by a first ion implantation;

(l) then forming silicon dioxide spacers conforming to the gate metal conductor and the pad oxide, wherein the pad oxide layer under the spacers is preserved; and (m) forming a raised source and drain region in the substrate defined by self alignment with the silicon dioxide spacers and the recessed gate metal conductor by a second ion implantation.

2. A method of manufacturing a short channel MOSFET device according to claim 1, wherein the semiconductor substrate comprises a single crystalline silicon substrate having a <100> crystallographic orientation.

3. A method of manufacturing a short channel MOSFET device according to claim 1, wherein the pad oxide layer forming step (a) comprises thermally growing a silicon dioxide layer having a thickness of between approximately 100 and 200 Angstroms.

4. A method of manufacturing a short channel MOSFET device according to claim 1, wherein the insultaing layer forming step (b) comprises low pressure chemical vapor deposition (LPCVD) of silicon nitride to a thickness of approximately 2000 Angstroms.

5. A method of manufacturing a short channel MOSFET device according to claim 1, wherein the opening forming step (e) comprises plasma etching with $CF_4O_2$.

6. A method of manufacturing a short channel MOSFET device according to claim 1, wherein the substrate portion of the opening in step (e) is etched to a depth between 500 and 2000 Angstroms.

7. A method of manufacturing a short channel MOSFET device according to claim 1, wherein the gate oxide formation in step (g) comprises depositing thermally grown silicon dioxide to a thickness of between approximately 100 and 200 Angstroms.

8. A method of manufacturing a short channel MOSFET device according to claim 1, wherein the deposition of metal in step (h) comprises the sputtering of Titanium/Tungsten (Ti:W).

9. A method of manufacturing a short channel MOSFET device according to claim 1, wherein the removal of the metal in step (i) comprises chemical-mechanical polishing (CMP).

10. A method of manufacturing a short channel MOSFET device according to claim 1, wherein the removal of the insulating layer in step (j) comprises hot phosphoric acid etching.

11. A method of manufacturing a short channel MOSFET device according to claim 1, wherein the first implantation in step (k) comprises implantation of Phosphorous at a dose of approximately $1-2\times10^{13}$ atoms/cm$^2$ and at an energy level in the range of 10–20 keV.

12. A method of manufacturing a short channel MOSFET device according to claim 1, wherein the spacer forming step (l) comprises thermally-growing SiO2 spacers at a temperature in the range of 500 to 900 degrees Centigrade.

13. A method of manufacturing a short channel MOSFET device according to claim 1, wherein the second implantation step (m) comprises implantation of Arsenic at a dosage of approximately $1\times10^{15}$ atoms/cm$^2$ and at an energy level greater than the range of 10–20 keV.

14. A method for manufacturing a short-channel MOSFET device in a single crystalline silicon semiconductor substrate of <100> crystallographic orientaion having a surface and containing shallow trench isolation (STI) regions, comprising the steps of:

(a) forming a pad oxide layer on the substrate surface by thermally growing a silicon dioxide layer having a thickness of between approximately 100 and 200 Angstroms;

(b) forming an insulating layer on the pad oxide layer by low pressure chemical vapor deposition (LPCVD) of silicon nitride to a thickness of approximately 2000 Angstroms;

(c) forming a photoresist layer on the insulating layer;

(d) patterning the photoresist layer to form an etching mask to define at least a gate region of the device;

(e) forming a recessed opening into the gate region of the substrate by $CF_4O_2$ plasma etching the insulating layer, the pad oxide layer and into the substrate to a depth between 500 and 2000 Angstroms relative to the surface of the semiconductor substrate;

(f) removing the photoresist from the substrate;

(g) depositing a thermally grown gate oxide layer on the substrate in the gate region opening to a thickness of between approximately 100 and 200 Angstroms;

(h) sputtering a layer of metal comprised of Titanium/Tungsten over the substrate thereby forming a metal gate conductor in the opening over the gate oxide layer;

(i) removing the layer of metal apart from the metal gate conductor from the top surface of insulating layer, by chemical-mechanical polishing (CMP);

(j) etching away the insulating layer with hot phosphoric acid, thereby exposing the metal gate conductor and the pad oxide surfaces;

(k) implantating Phosphorous at a dose of approximately $1-2\times10^{13}$ atoms/cm$^2$ and at an energy level in the range of 10–20 keV to form a lightly doped drain (LDD) region in the substrate defined by self alignment with the gate metal conductor;

(l) then forming silicon dioxide spacers conforming to the gate metal conductor and the pad oxide by thermally-growing silicon dioxide at a temperature in the range of 500 to 900 degrees Centigrade, whereby the pad oxide layer under the spacers is preserved; and (m) implantating Arsenic at a dosage of approximately $1\times10^{15}$ atoms/cm$^2$ and at an energy level greater than the range of 10–100 keV to form a raised source and drain region in the substrate defined by self alignment with the silicon dioxide spacers and the recessed gate metal conductor.

* * * * *